(12) United States Patent
Yang

(10) Patent No.: US 6,531,385 B2
(45) Date of Patent: Mar. 11, 2003

(54) METHOD OF FORMING METAL/DIELECTRIC MULTI-LAYERED INTERCONNECTS

(75) Inventor: Tien-Chu Yang, Hsinchu (TW)

(73) Assignee: Macronix International, Ltd., Hsinchu (TW)

( * ) Notice: Subject to any disclaimer, the term of this patent is extended or adjusted under 35 U.S.C. 154(b) by 0 days.

(21) Appl. No.: 09/976,759

(22) Filed: Oct. 12, 2001

(65) Prior Publication Data

US 2002/0102779 A1 Aug. 1, 2002

(30) Foreign Application Priority Data

Jan. 29, 2001 (TW) ........................................ 90101610 A

(51) Int. Cl.$^7$ .......................................... H01L 21/4763
(52) U.S. Cl. ........................ 438/622; 438/624; 438/626; 438/683; 438/769
(58) Field of Search ................................. 438/622, 624, 438/626, 627, 637, 639, 667, 672, 675, 683, 685, 688, 769; 257/751–752, 758, 760, 763, 765, 774

(56) References Cited

U.S. PATENT DOCUMENTS 5,946,601 A * 8/1999 Wong et al. ................. 438/783

6,400,023 B2 * 6/2002 Huang ......................... 257/758

\* cited by examiner

*Primary Examiner*—Phat X. Cao
*Assistant Examiner*—Theresa T. Doan
(74) *Attorney, Agent, or Firm*—J.C. Patents

(57) ABSTRACT

A method for forming a metal/dielectric multi-layered interconnect. A conductive layer is formed over a substrate. A protective film is formed over the conductive layer. A first high-density plasma fluorinated silica glass (HDP-FSG) layer is formed over the substrate by performing a HDP chemical vapor deposition with a low bias-voltage power. A second HDP-FSG layer is formed over the first HDP-FSG film by performing a HDP chemical vapor deposition at a higher bias-voltage power. A chemical-mechanical polishing is carried out to planarize the FSG layer. A silicon oxynitride is formed over the FSG layer. A via opening is formed in the FSG layer above the conductive layer. A barrier layer is formed onto the via opening and silicon oxynitride. Tungsten is deposited over the substrate filling the via opening. A tungsten chemical-mechanical polishing is carried out to remove excess tungsten and barrier layer above the silicon oxynitride layer.

16 Claims, 5 Drawing Sheets

US 6,531,385 B2

METHOD OF FORMING METAL/DIELECTRIC MULTI-LAYERED INTERCONNECTS

CROSS-REFERENCE TO RELATED APPLICATION

This application claims the priority benefit of Taiwan application serial no. 90101610, filed on Jan. 29, 2001.

BACKGROUND OF THE INVENTION

1. Field of Invention

The present invention relates to a method of forming a multi-layered interconnect. More particularly, the present invention relates to a method of forming a metal/dielectric multi-layered interconnect.

2. Description of Related Art

In the manufacturing of VLSI circuits, dielectric layers are mostly formed by chemical vapor deposition (CVD). One major advantage of using CVD is good step coverage which makes CVD a popular candidate for inter-metal dielectric process.

FIG. 1 is a schematic cross-sectional view showing a conventional metal/dielectric multi-layer interconnect. As shown in FIG. 1, a fluorinated silica glass (FSG) dielectric layer 102 is formed over a substrate 100 whereon a conductive layer 104 is formed. A cap layer 110 is formed over the surface of the dielectric layer 102. A via plug 106 is formed above the conductive layer 104. The surface of the conductive layer 104 and the surface of the substrate 100 are coated by a silicon oxide protective layer 108. A cap layer 110 is formed over the upper surface of dielectric 102. In addition, a barrier layer 105 is formed before formation of plug 106.

Conventional multi-layered interconnects are formed using fluorinated silica glass (FSG) as the dielectric material in a CVD. However, fluorine ions may react readily with metallic elements once they are released from the FSG material. Moreover, FSG material is less stable than silicon dioxide ($SiO_2$) and may lead to subsequent interconnect reliability problems. In addition, silicon oxide is frequently used as a protective layer for a conductive layer. A silicon oxide layer is thus only a weak barrier for fluorine ions and hence fluorine ions can penetrate through the silicon oxide layer and attack the conductive layer. Furthermore, the cap layer covering the FSG dielectric layer is a must and generally formed by a TEOS, $SiO_2$ or $SiO_2$+ plasma treatment. If the need for forming a cap layer over the FSG dielectric layer can somehow be removed, some cost and production time can be saved.

SUMMARY OF THE INVENTION

Accordingly, one object of the present invention is to provide a method for forming a metal/dielectric multi-layered interconnect capable of preventing damages to a conductive layer due to the use of fluorinated silica glass (FSG) material.

To achieve these and other advantages and in accordance with the purpose of the invention, the invention provides a method for forming a metal/dielectric multi-layered interconnect. A conductive layer is formed over a substrate. A protective layer is formed over the conductive layer. A high-density plasma fluorinated silica glass (HDP-FSG) film is formed over the substrate by performing UDP chemical vapor deposition with a low bias-voltage power. A HDP-FSG layer is formed over the HDP-FSG film by performing HDP chemical vapor deposition with a high bias-voltage power. A silicon oxynitride (SiON) is formed over the FSG layer. A via opening is formed in the FSG layer above the conductive layer. A barrier layer is formed over the substrate. Tungsten is deposited over the substrate to fill the via opening.

In this invention, a protective layer that serves as a barrier to the highly a penetrating fluorine ions is formed over the conductive layer. HDP chemical vapor deposition using a low bias-voltage power is next conducted to form a HDP-FSG dielectric layer so that damages to the protective layer are minimized. In the subsequent step, HDP chemical vapor deposition using a high bias-voltage power is conducted to form a HDP-FSG dielectric layer having a higher Si—F bonding stability and a lower moisture content. In addition, a silicon oxynitride layer is formed over the planarized FSG dielectric layer as a cap layer. The silicon oxynitride layer can serve not only as a barrier that isolates the FSG dielectric layer, but also as an anti-reflection coating in a photolithographic process for forming a via opening. Consequently, some cost and production time can be saved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
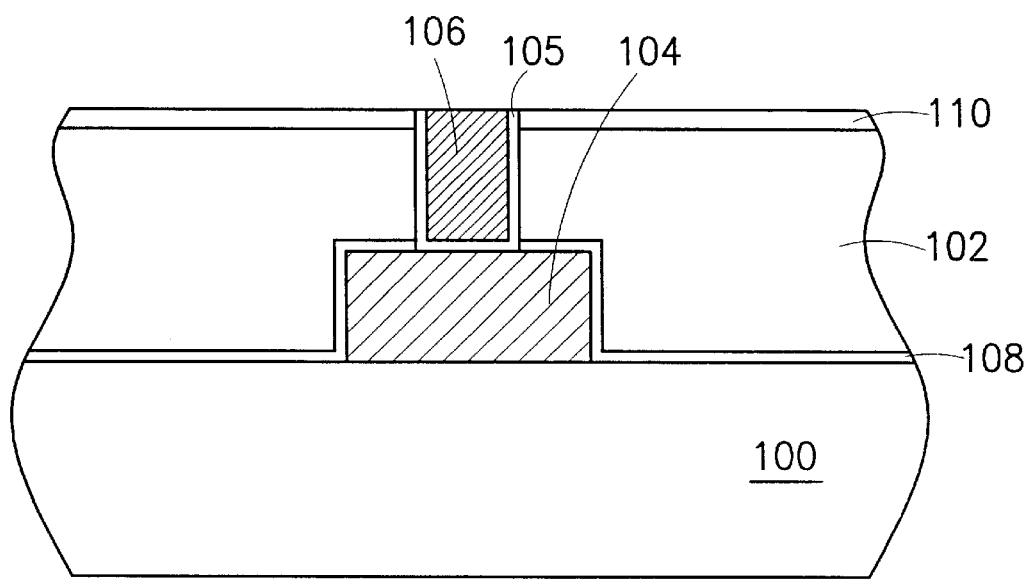
FIG. 1 is a schematic cross-sectional view showing a conventional metal/dielectric multi-layer interconnect.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic cross-sectional views showing the progression of steps for forming a metal/dielectric multi-layered interconnect according to a first preferred embodiment of this invention.

Figure 2A:
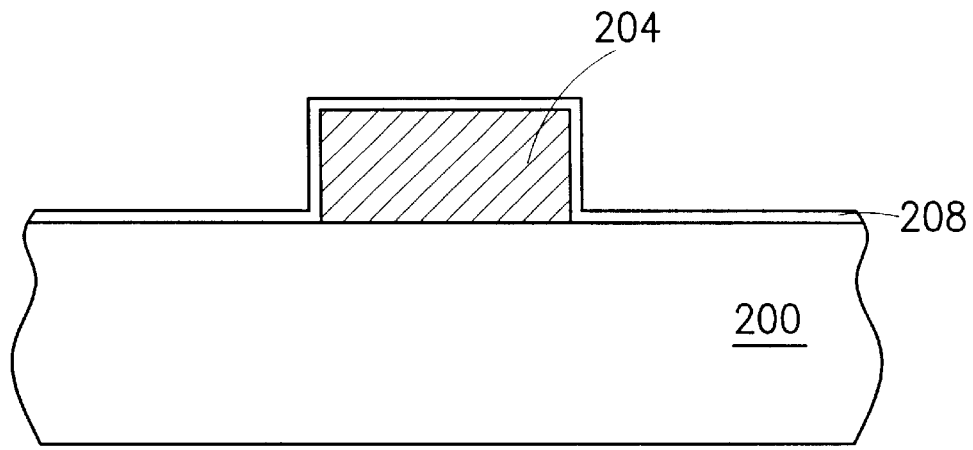
FIGS. 2A through 2F are schematic cross-sectional views showing the progression of steps for forming a metal/dielectric multi-layered interconnect according to a first preferred embodiment of this invention.

As shown in FIG. 2A, a conductive layer 204 is formed over a substrate 200. The conductive layer 204 can be an aluminum layer, for example. A protective layer 208 is formed over the conductive layer 204. The protective layer 208 can be a silicon oxynitride layer formed, for example, by depositing a thin nitrogen-doped silicon oxide over the conductive layer 204. The protective layer 208 on the conductive layer 204 prevents fluorine ions from reaching the conductive layer 204 and reacting with the metallic elements found therein.

Figure 2B:
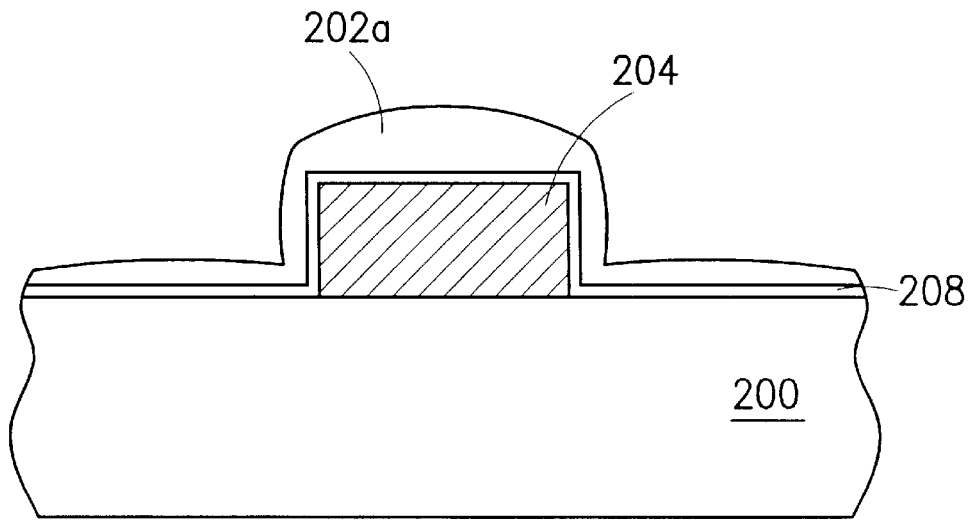

As shown in FIG. 2B, high-density plasma (HDP) chemical vapor deposition is carried out using a first bias-voltage power to form a fluorinated silica glass (FSG) film 202a over the substrate 200. The HDP-FSG film 202a is a dielectric layer. A bias-voltage power of less than 1500 W is used in the HDP chemical vapor deposition process. By using a lower power HDP vapor deposition, the HDP-FSG film 202a can avoid damages to the protective layer 208 and hence protects the conductive layer 204.

Figure 2C:
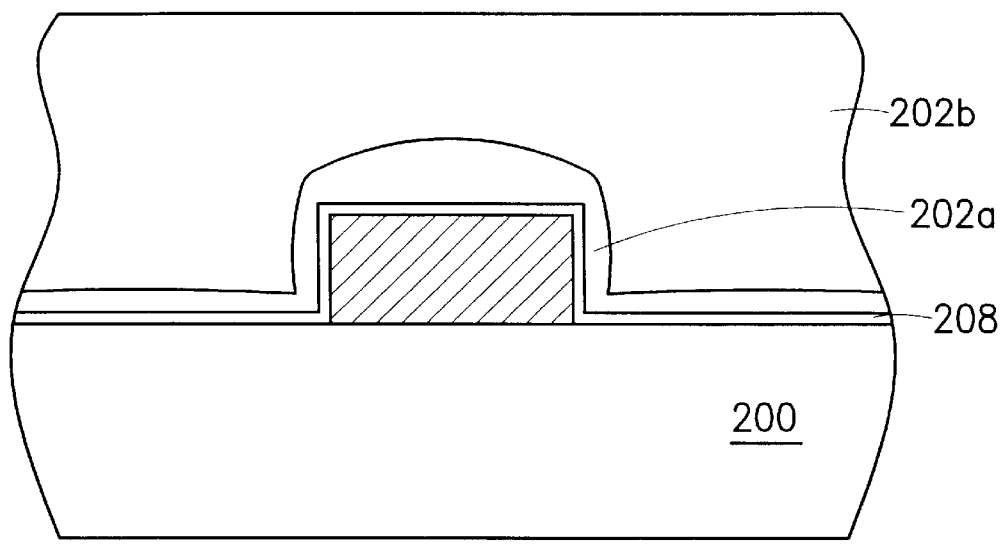

As shown in FIG. 2C, a high-density plasma (HDP) chemical vapor deposition is carried out using a second bias-voltage power to form a HDP-FSG layer 202b over the HDP-FSG film 202a. A bias-voltage power of higher than 1500 W is used in the HDP chemical vapor deposition process. The HDP-FSG layer 202b has higher Si—F bonding stability and lower moisture content. Thus, the HDP-FSG layer 202b reinforces overall stability of the composite dielectric layer. A chemical-mechanical polishing is conducted to planarize the HDP-FSG layer 202b.

Figure 2D:
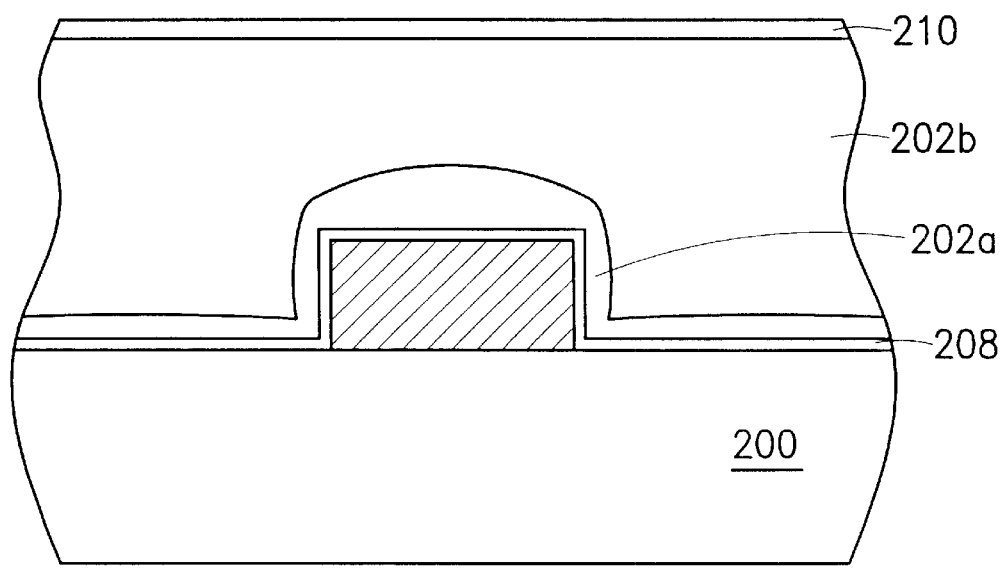

As shown in FIG. 2D, an anti-reflection coating 210 is formed over the HDP-FSG layer 202b. The anti-reflection coating 210 can be a silicon oxynitride layer, for example.

Figure 2E:
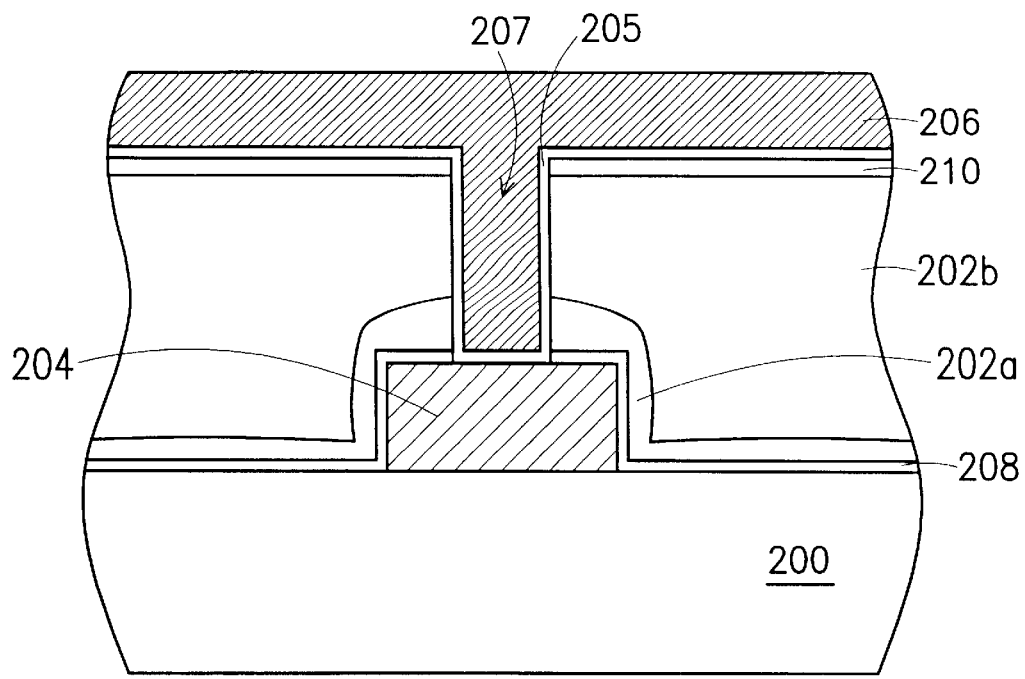

As shown in FIG. 2E, a via opening 207 is formed in the HDP-FSG layers 202a and 202b above the conductive layer 204. A barrier layer 205 is formed on the via opening 207 and anti-reflection coating 210. Thereafter, tungsten is deposited over the substrate and completely fills the via opening 207 to form a tungsten layer 206.

Figure 2F:
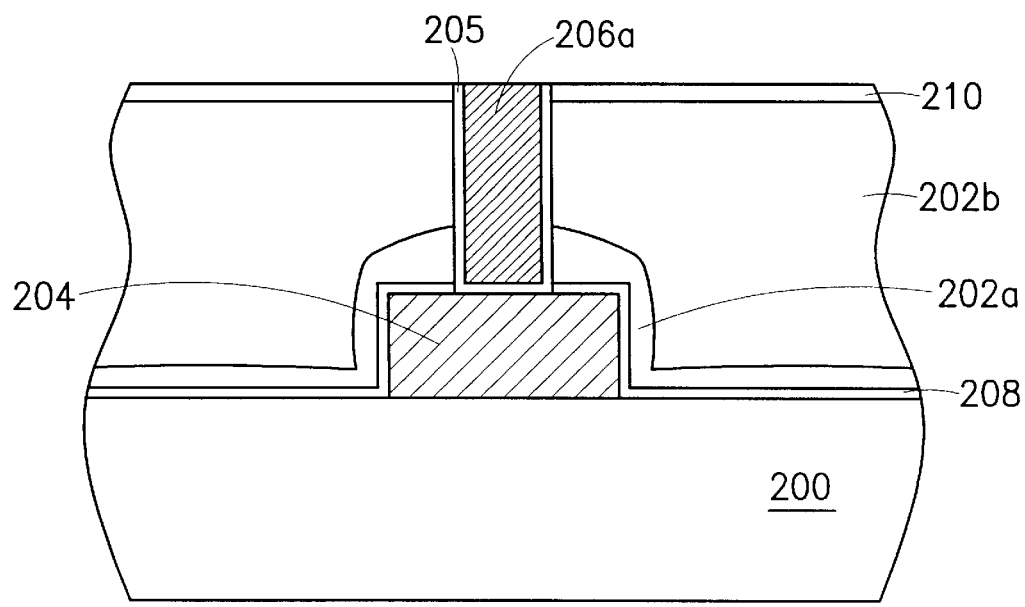

Finally, as shown in FIG. 2F, a tungsten chemical-mechanical polishing is carried out to remove excess tungsten and barrier material above the anti-reflection coating 210 and a via plug 206a is formed. Here, the anti-reflection coating 210 is retained to serve as a barrier layer to the FSG layer. In other words, the anti-reflection coating 210 is retained to function as a cap layer.

Figure 3A:
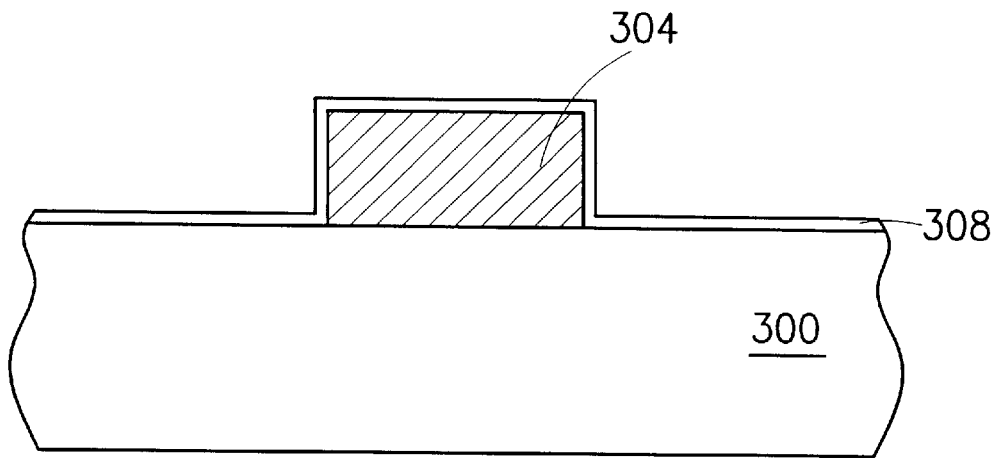
FIGS. 3A and 3B are schematic cross-sectional views showing a portion of the steps for forming a metal/dielectric multi-layered interconnect according to a second preferred embodiment of this invention.
Figure 3B:
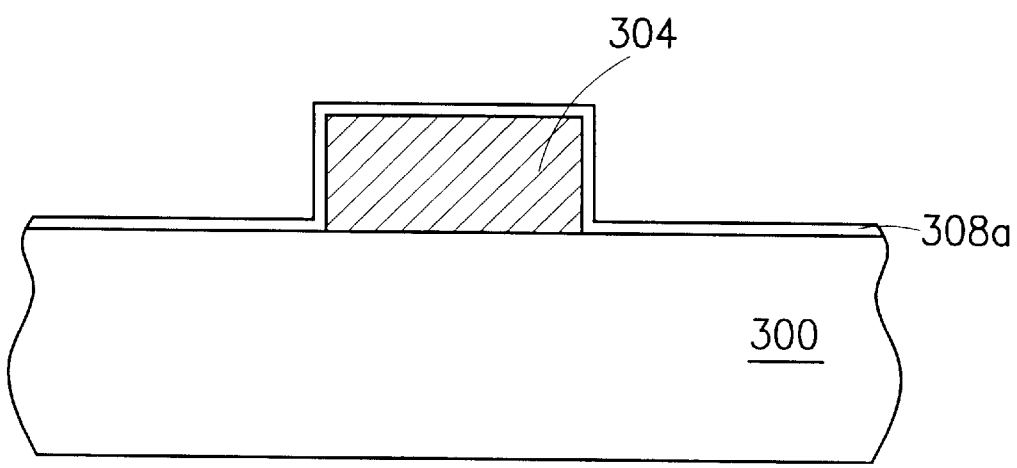

FIGS. 3A and 3B are schematic cross-sectional views showing a portion of the steps for forming a metal/dielectric multi-layered interconnect according to a second preferred embodiment of this invention.

As shown in FIG. 3A, a conductive layer 304 is formed over a substrate 300. The conductive layer 304 can be an aluminum layer, for example. A protective layer 308 is formed over the conductive layer 304. The protective layer 308 can be a silicon oxide layer formed, for example, by reacting silane ($SiH_4$) and oxygen together.

As shown in FIG. 3B, a plasma treatment 312 of the protective layer 308 is carried out to form a silicon oxynitride protective layer 308a. The plasma treatment 312 can be a $N_2O$, $N_2$, $NH_3$, or NO plasma treatment, for example. After the plasma treatment 312, the steps shown in FIGS. 2B–2F are repeated.

In summary, major aspects of this invention include the following:

1. A protective layer capable of stopping the diffusion of fluorine ions from a fluorinated silica glass is provided. This protective layer prevents the highly reactive fluorine ions from attacking the metallic elements within a conductive layer.
2. The dielectric layer is a composite fluorinated silica ,lass layer. A fluorinated silica glass film is first formed over the protective layer by performing a high-density plasma chemical vapor deposition conducted at a low bias-voltage power so that damage to the protective layer is minimized. This is followed by forming a second fluorinated silica glass layer over the first fluorinated silica glass film by performing the same high-density plasma chemical vapor deposition with a high bias-voltage power. The second fluorinated silica glass layer has higher Si—F bonding stability and lower moisture content.
3. A silicon oxynitride layer is formed over the fluorinated silica glass layer. silicon oxynitride layer serves as an anti-reflection coating for a subsequent photolithographic process and a barrier to the fluorinated silica glass layer. By eliminating the need to form a cap layer between the FSG dielectric layer and the anti-reflection coating, some production cost and time can be saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a metal/dielectric multi-layered interconnect, comprising:

providing a substrate;

forming a conductive layer over the substrate;

forming a protective layer over the conductive layer, wherein a material of the protective layer includes silicon oxynitride;

forming a first fluorinated silica glass film over the substrate by performing a high-density plasma vapor chemical deposition conducted using a first bias-voltage power;

forming a second fluorinated silica glass layer over the first fluorinated silica glass film by performing a high-density plasma chemical vapor deposition conducted using a second bias-voltage power, wherein the first bias-voltage power is lower than the second bias-voltage power;

forming an anti-reflection coating over the second fluorinated silica glass layer;

forming a via opening in the fluorinated silica glass layer above the conductive layer; and forming a barrier layer onto the via opening and anti-reflection coating layer;

forming a tungsten layer over the substrate such that the via opening is completely filled.

2. The method of claim 1, wherein the first bias-voltage power is less than 1500 W.

3. The method of claim 1, wherein the second bias-voltage power is higher than 1500 W.

4. The method of claim 1, wherein forming the protective layer includes depositing nitrogenoped silicon oxide over the conductive layer.

5. The method of claim 1, wherein forming the protective layer further includes:

forming a silicon oxide layer; and performing a plasma treatment on the silicon oxide layer.

6. The method of claim 5, wherein performing the plasma treatment on the silicon oxide includes conducting a $N_2O$, a $N_2$, a $NH_3$, or a NO plasma treatment.

7. The method of claim 1, wherein the conductive layer includes an aluminum layer.

8. The method of claim 1, wherein forming the anti-reflection coating includes depositing silicon oxynitride.

9. The method of claim 1, further comprising a step of performing chemical-mechanical polishing to planarize the second fluorinated silica glass layer after the step of forming the second fluorinated silica glass layer over the first fluorinated silica glass film.

10. The method of claim 1, further comprising a step of performing tungsten chemical-mechanical polishing to remove tungsten and barrier material above the anti-reflection coating after the step of forming a tungsten layer over the substrate.

11. A method of forming a metal/dielectric multi-layered interconnect, comprising:

providing a substrate;

forming a conductive layer over the substrate;

forming a fluorine-blocking protective layer over the conductive layer, wherein a material constituting the fluorine-blocking protective layer includes silicon oxynitride;

forming a first fluorinated silica glass film over the substrate by performing high-density plasma vapor chemical deposition conducted using a first bias-voltage power;

forming a second fluorinated silica glass layer over the first fluorinated silica glass film by performing high-density plasma chemical vapor deposition conducted using a second bias-voltage power, wherein the first bias-voltage power is lower than the second bias-voltage power;

performing chemical-mechanical polishing to planarize the second fluorinated silica glass layer;

forming an anti-reflection coating over the polished fluorinated silica glass layer;

forming a via opening in the fluorinated silica glass layer above the conductive layer;

forming a barrier layer over the substrate;

forming a tungsten layer over the substrate such that the via opening is completely filled; and performing tungsten chemical-mechanical polishing to remove tungsten and barrier material above the anti-reflection coating.

12. The method of claim 11, wherein forming the fluorine-blocking protective layer includes depositing nitrogen-doped silicon oxide over the conductive layer.

13. The method of claim 11, wherein forming the fluorine-blocking protective layer further includes:

forming a silicon oxide layer; and performing a plasma treatment on the silicon oxide layer.

14. The method of claim 13, wherein performing the plasma treatment on the silicon oxide includes conducting a $N_2O$, a $N_2$ or a NO plasma treatment.

15. The method of claim 11, wherein the conductive layer includes an aluminum layer.

16. The method of claim 11, wherein forming the anti-reflection coating includes depositing silicon oxynitride.

* * * * *